US005521413A

United States Patent [19]
Narita

[11] Patent Number: 5,521,413
[45] Date of Patent: May 28, 1996

[54] SEMICONDUCTOR DEVICE HAVING A SOLID METAL WIRING WITH A CONTACT PORTION FOR IMPROVED PROTECTION

[75] Inventor: Kaoru Narita, Tokyo, Japan

[73] Assignee: NEC Corporation, Tokyo, Japan

[21] Appl. No.: 346,307

[22] Filed: Nov. 23, 1994

[30] Foreign Application Priority Data

Nov. 25, 1993 [JP] Japan .................................. 5-319009

[51] Int. Cl.⁶ .......................... H01L 29/74; H01L 23/62; H02H 3/20
[52] U.S. Cl. .............................. 257/355; 257/173; 361/91
[58] Field of Search .................................. 257/546, 355, 257/356, 357, 358, 359, 360, 361, 362, 363, 174, 175, 655, 657, 536, 549; 361/90, 91, 92

[56] References Cited

U.S. PATENT DOCUMENTS 3,646,411  2/1972  Iwasa .................................... 257/655
4,984,031  1/1991  Rinderle ................................ 257/546
5,362,980  11/1994  Gough ................................... 257/355

FOREIGN PATENT DOCUMENTS 56-83964  7/1981  Japan .................................. 257/363
1-125862  5/1989  Japan .

Primary Examiner—Wael M. Fahmy
Attorney, Agent, or Firm—Burns, Doane, Swecker & Mathis

[57] ABSTRACT

On the surface of a p-type semiconductor substrate, an n-type diffusion layer is formed. The diffusion layer is in contact with an aluminum wiring via a contact hole formed through an interlayer insulation layer to electrical connection. Immediately beneath the contact portion of the aluminum wiring, a contact n-type diffusion layer having higher impurity concentration than the n-type diffusion layer and having deeper junction depth. Outside of the contact n-type diffusion layer is surrounded by a low impurity concentration n well. With the construction, when an electrostatic pulse is applied to an external terminal connected to the shallow diffusion layer, junction breakdown of the diffusion layer can be successfully prevented.

7 Claims, 3 Drawing Sheets

SEMICONDUCTOR DEVICE HAVING A SOLID METAL WIRING WITH A CONTACT PORTION FOR IMPROVED PROTECTION

BACKGROUND OF THE INVENTION

1. Field of the Invention

The present invention relates to a semiconductor device having a contact portion with a metal wiring. More particularly, the invention relates to a semiconductor device which has improved electrostatic breakdown withstanding ability.

2. Description of Related Art

The conventional method of prevention of junction breakdown in a semiconductor device will be discussed with reference to the technology disclosed in Japanese Unexamined Patent Publication (Kokai) No. Heisei 1-125862, as an example. FIG. 1 of the present application is a section of the semiconductor device proposed in the above-identified publication. As shown in FIG. 1, in a surface region of a p-type semiconductor substrate 1, a high impurity concentration n-type diffusion layer 2 is formed. On the surface of the substrate 1, an interlayer insulation layer 5 is formed. In the interlayer insulation layer 5, a contact hole 7 is formed. Also, on the interlayer insulation layer 5, an aluminum wiring 6 is patterned. A portion of the aluminum wiring 6 filled in the contact hole 7 is in contact with the n-type diffusion layer 2 at the surface of the substrate 1. By this, a contact portion between the aluminum wiring 6 and the n-type diffusion layer 2 is formed. Below the contact portion of the aluminum wiring 6, a low impurity concentration n well 3 is formed.

The semiconductor device constructed as set forth above has a structure resilient to breakdown at pn junction immediately below the connecting portion between the aluminum wiring 6 and the n-type diffusion layer 2 even when excessive voltage, such as an electrostatic pulse, is applied to an external terminal connected to the aluminum wiring 6, for the presence of n well 3 having low impurity concentration beneath the contact portion of the aluminum wiring 6 to provide high junction withstanding voltage.

However, in the above-mentioned semiconductor device, in particular, when n-type diffusion layer 2 becomes shallow, to the extent to less than or equal to 0.5 µm due to down-sizing of the device, upon application of the electrostatic pulse, almost all of the current flows on the surface of the semiconductor. Therefore, the junction withstand voltage becomes the lowest in the vicinity of a portion 8 of FIG. 1. This encounters a problem in that current may flow into the substrate at this portion 8.

Therefore, when an electrostatic breakdown protective element is constructed by providing two diffusion layers of this type in the vicinity of each other (see FIG. 5), while it is expected that the current may flow between the diffusion layers upon application of high voltage, the current flows between the substrate and the diffusion layer to make it impossible to operate the protective element normally. As a result, discharge becomes insufficient to possibly cause breakdown of the internal circuit due to elevated voltage.

SUMMARY OF THE INVENTION

It is therefore an object of the present invention to provide a semiconductor device which permits a sufficient amount of current to flow to a low impurity concentration region (n well) surrounding a contact portion of a wiring upon application of an excessive voltage, such as electrostatic pulse, and thus can avoid junction breakdown in high impurity concentration region (n-type diffusion layer).

Another object of the present invention is to provide a semiconductor device which permits an electrostatic breakdown protective element employing the diffusion layer of the type set forth above to operate effectively and whereby makes it possible to protect an internal circuit from causing electrostatic breakdown by preventing internal voltage from elevating.

According to the present invention, there is provided a semiconductor device having a contact portion with a metal wiring, comprising: a semiconductor substrate of a first conductive type; a first diffusion layer of a second conductive type and formed at the surface region of said semiconductor substrate; a metal wiring connecting to said first diffusion layer; a second conductive type second diffusion layer formed immediately beneath a contact portion of said metal wiring, said second diffusion layer having higher impurity concentration than that of said first diffusion layer and having deeper depth in junction; and a third diffusion layer formed at outside of said second diffusion layer with surrounding said second diffusion layer and having second conductive type, said third diffusion layer having the impurity concentration lower than that of said first diffusion layer.

In a semiconductor device according to the present invention, immediately beneath a metal wiring, a contact (second) diffusion layer having higher impurity and a deeper junction depth than a first diffusion layer is provided for connecting the first diffusion layer to the metal wiring. A low impurity concentration (third) diffusion layer is formed around the contact (second) diffusion layer. Therefore, according to the present invention, when an electrostatic pulse is applied to the metal wiring, concentration of current to the first diffusion layer can be suppressed so as to prevent the first diffusion layer from causing junction breakdown. Accordingly, when an electrostatic breakdown protective element is formed with employing the contact-diffusion layer structure, a problem in that a current flows from the substrate surface diffusion layer to the substrate upon charging electrostatic pulse, can be solved. Therefore, according to the present invention, the semiconductor device which is superior in protecting function of the internal circuit and has high electrostatic breakdown withstanding ability.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DETAILED DESCRIPTION OF THE PREFERRED EMBODIMENT

The preferred embodiment of a semiconductor device according to the present invention will be discussed hereinafter in detail with reference to FIGS. 2 to 5. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
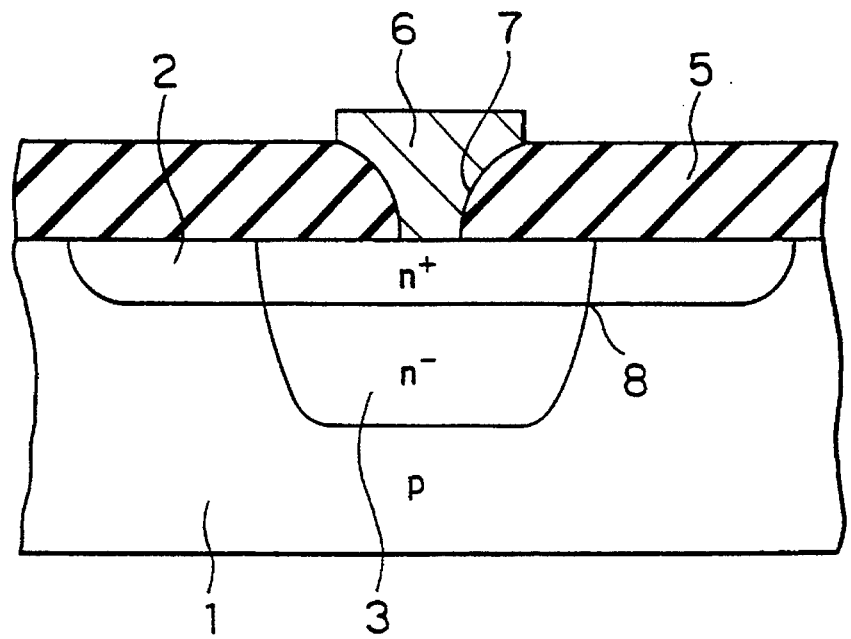
FIG. 1 is a section showing the conventional semiconductor device having a contact portion.
Figure 2:
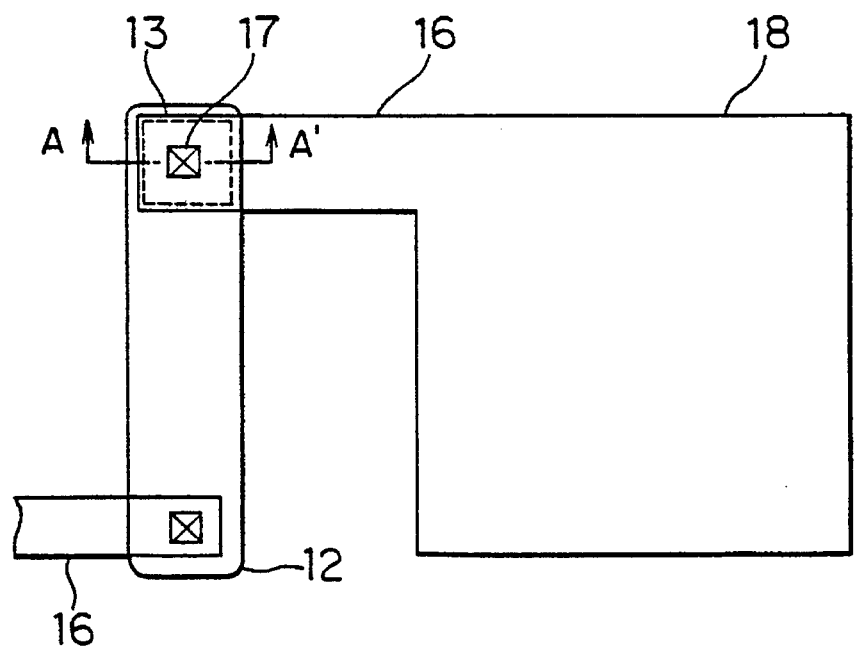
FIG. 2 is a plan view of the first embodiment of a semiconductor device having a contact portion, according to the present invention.
Figure 3:
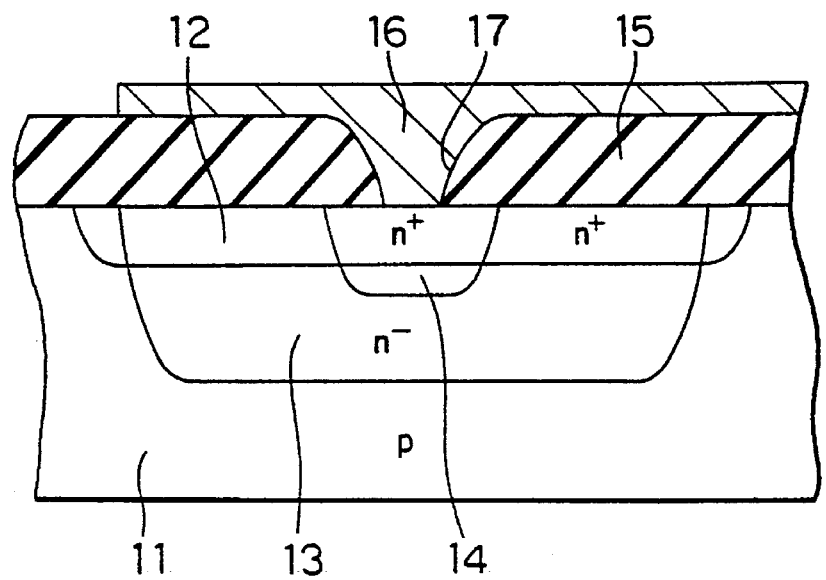
FIG. 3 is a section taken along line A—A' of FIG. 2.

FIG. 2 is a plan view of the first embodiment of a semiconductor device with a contact portion according to the present invention, and FIG. 3 is a section taken along line A—A' of FIG. 2. As shown in FIGS. 2 and 3, in the surface region of a p-type semiconductor substrate 11 having an impurity concentration of $10^{15}/cm^3$, a n-type diffusion layer 12 (first diffusion layer) forming a diffusion resistor is formed. The n-type diffusion layer has an impurity concentration of $10^{20}/cm^3$ and a depth of 0.3 μm. On the surface of the substrate 11, an interlayer insulation layer 15 is formed. In the interlayer insulation layer 15, a contact hole 17 is formed. On the interlayer insulation layer 15, an aluminum wiring 16 is patterned. Also, the aluminum wiring 16 is filled in the contact hole 17.

Beneath the contact portion of the aluminum wiring 16, a contact n-type diffusion layer 14 (second diffusion layer) is formed. The contact n-type diffusion layer 14 has an impurity concentration of $2\times10^{20}/cm^3$ and a depth of 0.5 μm. By this, a portion of the aluminum wiring 16 filled in the contact hole 17 is established electrical connection to the diffusion layer 12 through the diffusion layer 14. At the outside of this n-type diffusion layer 14, an n well 13 (third diffusion layer) having an impurity concentration of $10^{16}/cm^3$ and a depth of 2 μm is formed surrounding the n-type diffusion layer 14.

Here, the contact n-type diffusion layer 14 is the region formed by introducing the impurity into the surface of the substrate via the contact hole 17 opened though the interlayer insulation layer 15. Therefore, this diffusion layer 14 is a region not spread beyond the contact portion. In contrast to this, the n well 13 is formed to have one edge of the length close to the width of the n-type diffusion layer 12.

As shown in FIG. 2, one end of the aluminum wiring 16 is connected to a terminal 18 and the other end is connected to an internal circuit (not shown).

In the semiconductor device constructed as set forth above, since the contact n-type diffusion layer 14 having higher impurity concentration than the n-type diffusion layer 12 reaches the n well 13 through the n-type diffusion layer 12, substantial amount of current flows in the n well 13 upon application of an excessive voltage pulse. Then, since the n well 13 is formed in the extend corresponding to the width of the n-type diffusion layer 12, breakdown of the pn junction of the n-type diffusion layer 12 can be suppressed.

Figure 4:
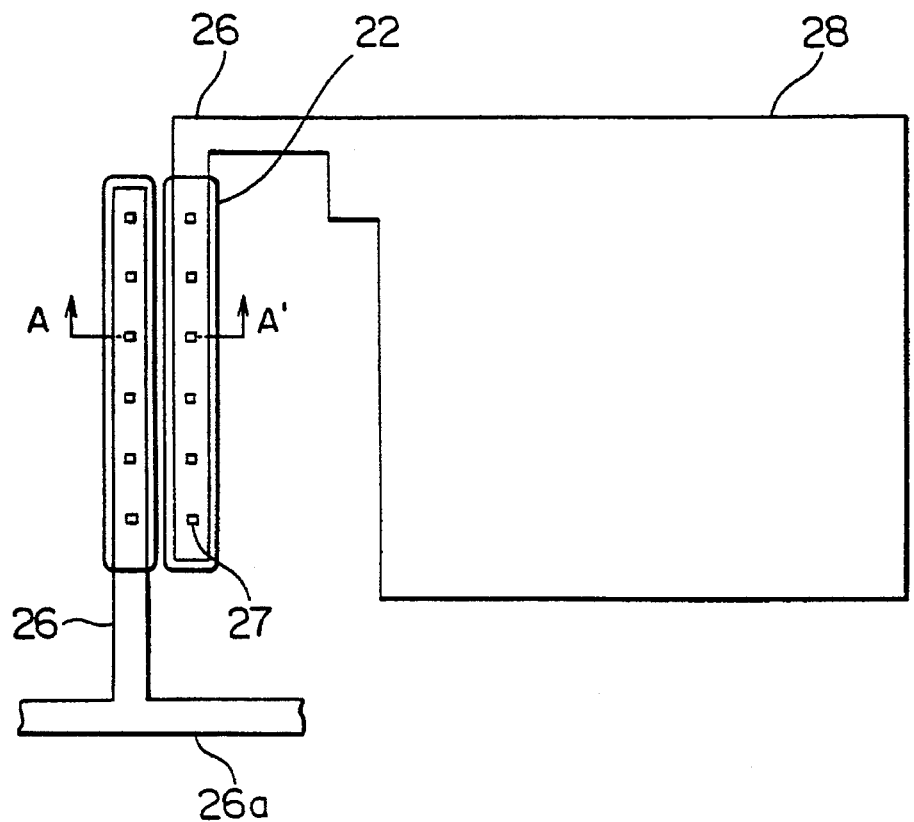
FIG. 4 is a plan view of the second embodiment of a semiconductor device having a contact portion, according to the present invention.
Figure 5:
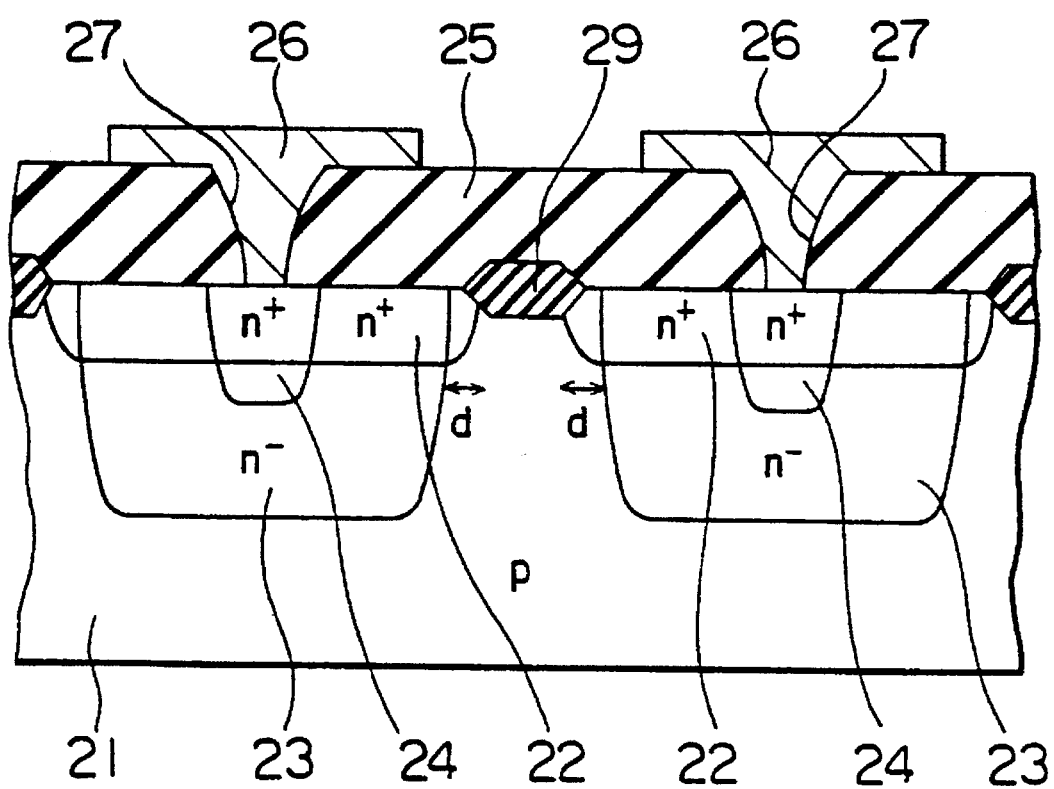
FIG. 5 is a section taken along line A—A' of FIG. 4.

FIG. 4 is a plan view of the second embodiment of a semiconductor device according to the present invention, and FIG. 5 is a section taken along line A—A' of FIG. 4. The shown embodiment is an example for the case where the present invention is applied for an electrostatic breakdown protective element.

As shown in FIG. 4, the aluminum wiring 26 connected to the terminal 28 and the aluminum wiring 26 connected to a GND wiring 26a are connected to n-type diffusion layer 22 via the contact hole 27.

As shown in FIG. 5, the n-type diffusion layer 22 (first layer) contacting with the aluminum wiring 26 is formed within the surface region of the p-type semiconductor substrate 21 with separating by an element separating insulation layer 29. Here, the impurity concentration of the p-type semiconductor substrate 21 is $10^{15}/cm^3$ for example. The impurity concentration of the n-type diffusion layer 22 is $5\times10^{19}/cm^3$ and the depth of the junction is 0.3 μm. Immediately beneath the contact portion of the aluminum wiring 26, impurity is implanted through the contact hole 27 to form the contact n-type diffusion layer 24 (second diffusion layer) which has the impurity concentration of $10^{20}/cm^3$ and depth of 0.5 μm. At the outside of the contact n-type diffusion layer 24, an n well 23 (third diffusion layer) having the impurity concentration of $10^{16}/cm^3$ and the depth of 2.5 μm is formed. Here, a distance d of the n well 23 to the element separating insulation layer 29 is 1 μm, for example. The entire surface of the surface of the substrate is coated with the interlayer insulation layer 25.

In the electrostatic breakdown protective element shown in FIGS. 4 and 5, when an excessive voltage is applied to the terminal 28, the potential is transmitted to the contact n-type diffusion layer 24 via the aluminum wiring 26. Since the impurity concentration of the contact n-type diffusion layer 24 is higher than that of the n-type diffusion layer 22, the current flows with spreading to the contact n-type diffusion layer 24 and the n well 23 without being limited to the substrate surface.

Since the portion of the n-type diffusion layer 22 extending from the n well 23 is short, i.e. d=1 μm, current due to breakdown of the junction will never flow from the n-type diffusion layer 22 (left in FIG. 5, for example) to the substrate 21 and the current flows to an n-type diffusion layer 22 (right in FIG. 5) opposing to the n-type diffusion layer 22 (left in FIG. 5). When the opposing n-type diffusion layers 22 (left and right in FIG. 5) conducts each other, parasitic npn transistor becomes conductive to quickly discharge the static electricity to certainly protect the internal circuit.

Through experiments made by the inventor, when the distance d of the n well 23 to the element separating insulation layer 29, which is also the length of the n-type diffusion layer 22 extending from the n well 23, is less than or equal to 2 μm, it has been found that the parasitic transistor may operate without causing pn junction breakdown of the n-type diffusion layer 22.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, while, in the shown embodiment, n well is formed within the n-type diffusion layer in planar form, such specific configuration is not essential to the present invention and the n well can be extended to the outside of the n-type diffusion layer. Also, while the foregoing discussion has been made with respect to a method to establish a contact to the n-type diffusion layer with utilizing the p-type semiconductor substrate, the present invention may be applicable for implementation of the invention as the polarities of the elements is opposite. Also, the objective semiconductor for the present invention may be either MOS type or bipolar type and should not be limited to the specific configuration and application.

What is claimed is:

1. A semiconductor device having a metal wiring with a contact portion, comprising:

a semiconductor substrate of a first conductive type having a surface region;

a first diffusion layer of a second conductive type and formed in said surface region of said semiconductor substrate;

a metal wiring being connected to said first diffusion layer;

a second conductive type second diffusion layer formed immediately beneath said contact portion of said metal wiring, said second diffusion layer having higher impurity concentration than that of said first diffusion layer and having a deeper junction depth than said first diffusion layer; and a third diffusion layer formed outside of said second diffusion layer, surrounding said second diffusion layer and having said second conductive type, said third diffusion layer having an impurity concentration lower than that of said first diffusion layer, the area of said third diffusion layer being smaller than that of said first diffusion layer.

2. A semiconductor device as set forth in claim 1, wherein said first diffusion layer has a depth which is less than or equal to 0.5 µm.

3. A semiconductor device as set forth in claim 2, wherein the impurity concentration of said third diffusion layer is lower than that of said first diffusion layer by an order of magnitude.

4. A semiconductor device as set forth in claim 1, wherein said metal wiring is connected to an external terminal.

5. A semiconductor device having a metal wiring with a contact portion comprising:

a semiconductor substrate of a first conductive type having a surface region;

an element separation oxide layer formed in said surface region of said semiconductor substrate;

a pair of first diffusion layers of a second conductive type formed in said surface region of said semiconductor substrate at both sides of said element separating oxide layer;

a metal wiring connected to said first diffusion layers;

second diffusion layers of second conductive type formed immediately beneath said contact portion of said metal wiring, having higher impurity concentration than that of said first diffusion layers, and having a deeper junction depth than said first diffusion layers; and third diffusion layers of the second conductive type and formed outside of said second diffusion layers, and surrounding said second diffusion layers, said third diffusion layers having an impurity concentration lower than that of said first diffusion layers, the area of said third diffusion layers being smaller than that of said first diffusion layers.

6. A semiconductor device as set forth in claim 5, wherein one end of said metal wiring contacts one of a ground wiring and a power source wiring, and another end of said metal wiring is connected to an external terminal.

7. A semiconductor device as set forth in claim 5, wherein said first diffusion layers are in contact with said element separating oxide layer and a distance between said third diffusion layers and said element separating oxide layer is less than or equal to 2 µm.

\* \* \* \* \*